United States Patent
Bushard et al.

[11] Patent Number: 5,819,072
[45] Date of Patent: Oct. 6, 1998

[54] METHOD OF USING A FOUR-STATE SIMULATOR FOR TESTING INTEGRATED CIRCUIT DESIGNS HAVING VARIABLE TIMING CONSTRAINTS

[75] Inventors: Louis B. Bushard, Andover; Peter B. Criswell, Bethel; Douglas A. Fuller, Eagan; James E. Rezek, Mounds View, all of Minn.; Richard F. Paul, Burlington, Vt.

[73] Assignee: Unisys Corporation, Blue Bell, Pa.

[21] Appl. No.: 671,432

[22] Filed: Jun. 27, 1996

[51] Int. Cl.⁶ .................................................. G06F 9/455
[52] U.S. Cl. ........................................... 395/500; 364/490
[58] Field of Search .................... 364/488, 489, 364/490, 491, 578; 395/500

[56] References Cited

U.S. PATENT DOCUMENTS

| | | | |
|---|---|---|---|
| 4,695,968 | 9/1987 | Sullivan, II et al. | 364/578 |
| 4,924,430 | 5/1990 | Zasio et al. | 364/578 |
| 5,051,938 | 9/1991 | Hyduke | 364/578 |
| 5,062,067 | 10/1991 | Schaefer et al. | 364/578 |
| 5,095,454 | 3/1992 | Huang | 364/578 |
| 5,191,541 | 3/1993 | Landman et al. | 364/489 |
| 5,220,512 | 6/1993 | Watkins et al. | 364/489 |
| 5,384,720 | 1/1995 | Ku | 364/578 |
| 5,400,270 | 3/1995 | Fukui | 364/578 |
| 5,404,311 | 4/1995 | Isoda | 364/490 |
| 5,448,497 | 9/1995 | Ashar et al. | 364/489 |
| 5,457,638 | 10/1995 | Ashar et al. | 364/490 |
| 5,508,937 | 4/1996 | Abato et al. | 364/488 |
| 5,572,717 | 11/1996 | Pedersen | 395/555 |
| 5,596,505 | 1/1997 | Steinweg et al. | 364/490 |
| 5,623,418 | 4/1997 | Rostoker et al. | 364/489 |
| 5,657,239 | 8/1997 | Grodstein et al. | 364/488 |

*Primary Examiner*—Kevin J. Teska
*Assistant Examiner*—Dan Fiul
*Attorney, Agent, or Firm*—Charles A. Johnson; Mark T. Starr

[57] ABSTRACT

Method for performing critical path timing analysis on a circuit design having different timing constraints for multiple parallel paths. Method includes clearing the state of the circuit design, setting control lines in the circuit design to a selected set of control signals, and identifying blocking nets of the circuit design to be flagged for timing analysis by simulating the circuit design with the selected set of control signals as input signals. Identified blocking points are added to a list which identifies paths in the circuit design to be analyzed. All possible sets of control signals are processed. Timing analysis is then performed on the circuit design using the list as input data. A critical step is the identification of the blocking points. Blocking points are identified for each net input to a gate in the circuit design having an unknown value, and a known value on an output net from the gate for the selected set of control signals. Blocking points input to the timing analysis tool ensure that these nets are analyzed during critical path timing analysis, so all possible timing violations in the circuit design are detected.

17 Claims, 8 Drawing Sheets

FIG. 1

PRIOR ART

METHOD OF USING A FOUR-STATE SIMULATOR FOR TESTING INTEGRATED CIRCUIT DESIGNS HAVING VARIABLE TIMING CONSTRAINTS

BACKGROUND OF THE INVENTION

1. Field of the Invention

This invention relates generally to electronic design automation (EDA) systems used for designing complex integrated circuits. The invention is more specifically related to a method of using a four state simulator on integrated circuit designs having variable timing constraints to ensure sufficient timing violation detection coverage.

2. Background Information

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation computer system, with well-known input devices being used to receive design information from the chip designer and output devices, such as computer displays, being used to provide visual feedback of the design to the designer as it is being constructed. Such software is typically implemented as part of an electronic design automation system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

Two common methods for specifying the design are schematic capture and hardware description languages. Both of these methods allow a circuit designer to specify the circuit at the register transfer level. The schematic capture method provides a sophisticated user interface which allows a logic circuit to be drawn in graphical form on a computer display. The design is often specified with standard logic symbols such as NAND gates and NOR gates. Using this method, the circuit is defined in small building blocks. The names of the building blocks are specified by the circuit designer. Thus, they usually are logical names with specific functional meaning.

Encoding the design in a hardware description language (HDL) is the other major design entry technique used to specify modern integrated circuits. Hardware description languages are specially developed to aid a designer in describing a circuit. These languages often contain specific functions and syntax to allow complex hardware structures to be described in a compact and efficient way. The HDL program specifying the design may be compiled into the same data format produced by schematic capture, thereby providing a designer great flexibility in methods used for specifying a logic design. The design concepts of libraries, cells, hierarchies, interconnects, etc., are equally applicable to designs specified by a HDL or by schematic capture.

The output of design capture and logic synthesis tools (which reduces the HDL to a gate-level structure) is a logic design database which completely specifies the logical and functional relationships among the components of the design. Once the design is captured, it is necessary to verify that the logic definition is correct and that the circuit implements the function expected by the designer. This verification is currently achieved by timing analysis and simulation tools. The timing analysis and simulation tools determine whether all register-to-register transfer times are within the constraints dictated by the clock speed of the integrated circuit design. The data representation in the logic design database may be reformatted as needed prior to use by the timing analysis and simulation tools. The design undergoes design verification analysis in order to detect flaws in the design. The design is also analyzed by simulating the device resulting from implementation of the design to assess its functionality. If timing or other errors are found or the resulting functionality is unacceptable, the designer modifies the design as needed. These design iterations help to ensure that the design satisfies its requirements.

Figure 1:
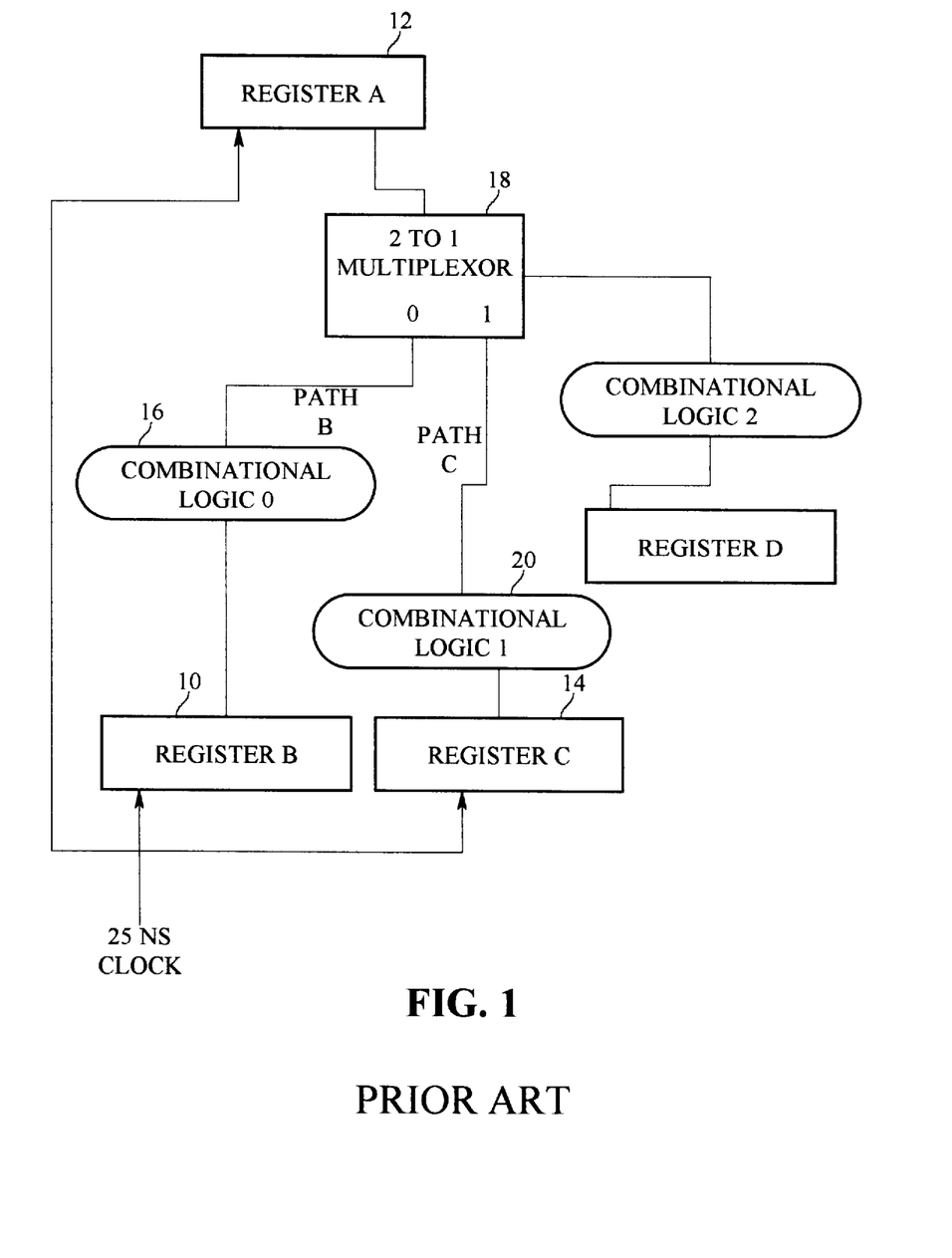
FIG. 1 is a prior art diagram showing a simple example of a logic cone.

Timing analysis tools generally operate on design netlists stored in the logic design database which have been converted to an internal database representation. Each part of the overall system is defined by a netlist. These netlists represent the designs for integrated circuits, printed circuit boards, or backpanels. When determining register-to-register transfer times for the netlists of an integrated circuit design, the timing analysis tools operate on portions of the logic called "cones". A cone consists of a register, all of the combinational logic feeding that register, and all of the registers feeding that combinational logic. FIG. 1 is a prior art diagram showing a simple example of a logic cone. When a timing analysis program processes a logic cone, it can use several different algorithms to determine if a timing violation exists. One method, called "path enumeration", consists of calculating the propagation delay for every register-to-register path in the cone, making sure that each path does not violate timing requirements. Using the path enumeration method on the sample cone of FIG. 1, a typical timing analysis program calculates the propagation delay for every path between Register B 10 and Register A 12 and the delay for every path between Register C 14 and Register A 12. Since all devices in this sample cone are clocked by a 25 nanosecond (ns) clock, any delay that exceeds 25 ns is flagged as a timing violation.

While the path enumeration method is thorough, it is also slow. A more efficient algorithm, termed "critical path analysis", entails keeping track of only the slowest path yet encountered during timing analysis processing. To accomplish this, the timing analysis tool starts tracing forward through all paths of the logic cone at once, keeping track of the propagation delay for each path. If any two paths meet at a single gate, only the longest of the two delays is retained. In addition, only the longer path is retained as a potential timing violator. Eventually, each path will terminate at a bit in a destination register and only a single propagation delay will be associated with that path. This method can be demonstrated by again referring to FIG. 1. The timing analysis tool will begin processing at Register B 10 and Register C 14 and trace forward through the logic cone. The net shown that is driven by Register B 10 passes through Combinational Logic 0 16 before reaching a 2 To 1 Multiplexor 18, while the net that is driven by Register C 14 passes through Combinational Logic 1 20 to the 2 To 1 Multiplexor 20. Assume for example purposes that the propagation time through Combinational Logic 0 16 is significantly longer than through Combinational Logic 1 20. The timing analysis tool therefore ignores the timing associated with the Register C net and retains the Register B path as a potential timing violator.

Although the critical path algorithm is faster than the path enumeration method, it does not work well with integrated circuit designs having timing sequences which are used to generate load clock pulses. This situation is also known as the "parallel path" problem. A parallel path problem exists for timing analysis when multiple paths from the same source to the same destination in an integrated circuit design have different timing. A side effect of having the parallel path problem in a design is that during the timing analysis process, either one of the paths is overconstrained, or the other path is underconstrained. Thus, in a single pass of a timing analysis program operating on an integrated circuit design, one cannot determine which of the multiple paths is slower and possibly resulting in a timing violation. This is because in critical path algorithms, only the worst case path is kept; other paths are not checked for timing violations at all. If parallel paths are not clocked the same, when using existing timing analysis tools, one of the parallel paths will not be checked. Therefore, an improved method of processing critical path algorithms on integrated circuit designs having variable timing constraints (i.e., parallel paths) is needed to ensure that all potential timing violations are detected and identified for such circuits.

SUMMARY OF THE INVENTION

An object of this invention is to perform critical path timing analysis on integrated circuit designs having variable timing constraints such that all potential timing violations are detected.

Another object of this invention is to decrease the time required for the integrated circuit design and test cycle using electronic design automation systems.

Yet another object of this invention is minimize the time spent performing timing analysis on integrated circuit designs.

A further object of this invention is to detect and identify timing violations existing in integrated circuit designs having parallel paths between a source point in the circuit to a destination point in the circuit with different timing constraints.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended claims.

According to the present invention, the foregoing and other objects and advantages are attained by a novel method for performing timing analysis on a circuit design having different timing constraints for multiple parallel paths. The method includes steps for clearing the state of the circuit design, setting control lines in the circuit design to a selected set of control signals, and identifying blocking points of the circuit design to be flagged for timing analysis by simulating the circuit design with the selected set of control signals as input signals. The identified blocking points are added to a list which identifies paths in the circuit design to be analyzed. These steps are performed for all possible sets of control signals. Finally, timing analysis is performed on the circuit design using the list as input data. A critical step in the method is the identification of the blocking points. The method identifies blocking nets for each net input to a gate in the circuit design having an unknown value, and a known value on an output net from the gate for the selected set of control signals.

Also according to the present invention, the foregoing objects and advantages are attained by a novel system for performing timing analysis on a circuit design having different timing constraints for multiple parallel paths. The system includes a list for storing identifiers of paths in a circuit design to be analyzed, a four-state simulator for clearing the state of the circuit design, setting control lines in the circuit design to a selected set of control signals, identifying blocking points of the circuit design to be flagged for timing analysis by simulating the circuit design with the selected set of control signals as input signals, and for adding the blocking points to the list, and a timing analysis tool for performing timing analysis on the circuit design using the list Still other objects and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims.

DESCRIPTION OF THE PREFERRED EMBODIMENT

The detailed description which follows is presented largely in terms of algorithms and symbolic representations of operations on data bits within a computer memory and/or activities of a human circuit designer. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with me by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method of operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons. Because the computers and operating systems which may be used in practicing the present invention consist of many diverse elements, no detailed program listing has been provided. It is considered that the operations and other procedures described herein and illustrated in the accompanying figures are sufficiently disclosed to permit one of ordinary skill to practice the present invention.

Figure 2:
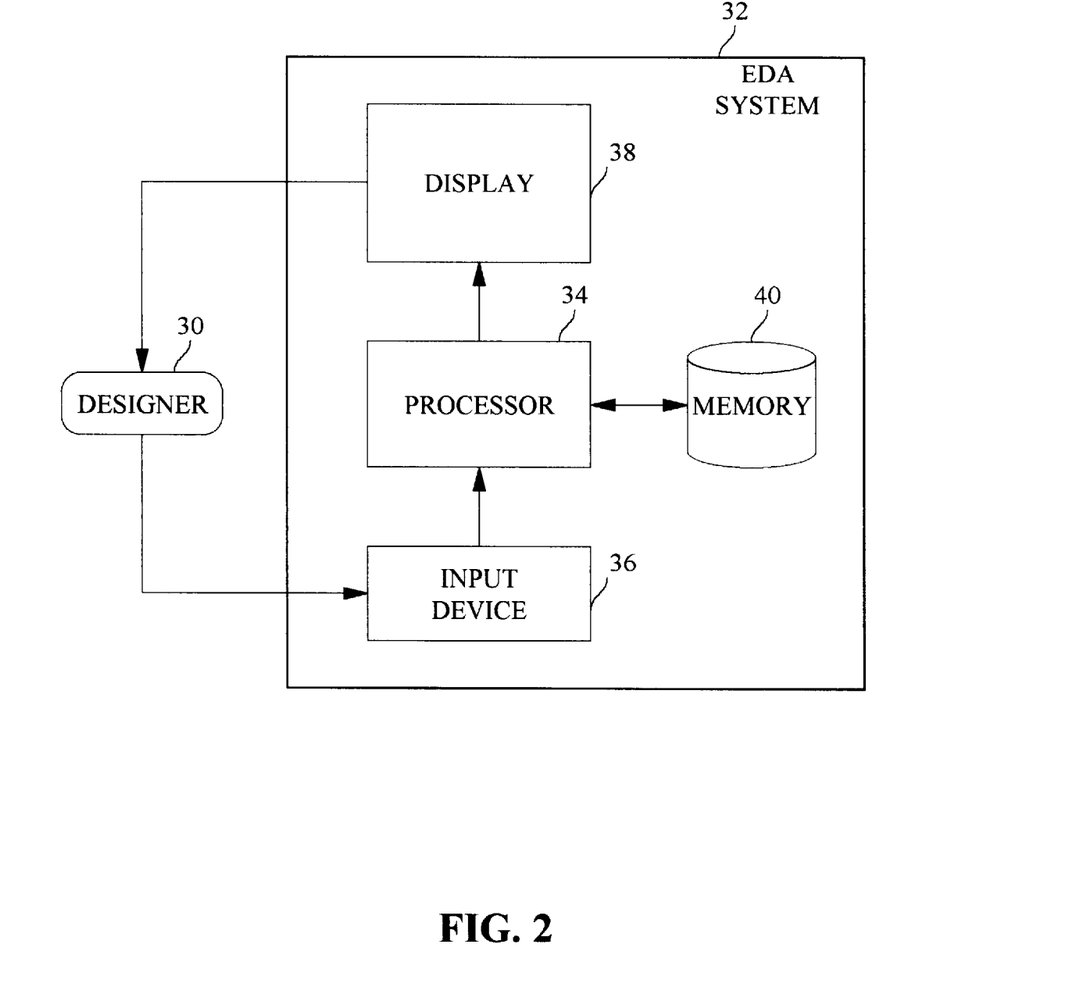
FIG. 2 is a block diagram of the computer-based environment of the present invention.

FIG. 2 is a block diagram of the computer-based environment of the present invention. A Designer 30 interacts with an electronic design automation (EDA) System 32 to enter an integrated circuit design, validate the design, place the design's components on a chip, and route the interconnections among the components. The integrated circuit may be an application specific integrated circuit (ASIC). The EDA System 32 includes a Processor 34, which executes operating system software as well as application programs known as EDA software. The Processor is found in all general purpose computers and almost all special purpose computers. The EDA System 32 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc., may also be used. The Designer 30 enters design information into the EDA System by using a well-known Input Device 36 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 38. The Display is used to display messages and symbols to the Designer. Such a Display 38 may take the form of any of several well-known varieties of CRT displays. The EDA software being executed by the Processor 34 stores information relating to the logic design in Memory 40. The Memory may take the form of a semiconductor memory, magnetic disks, optical disks, magnetic tape or other mass storage device.

Figure 3:
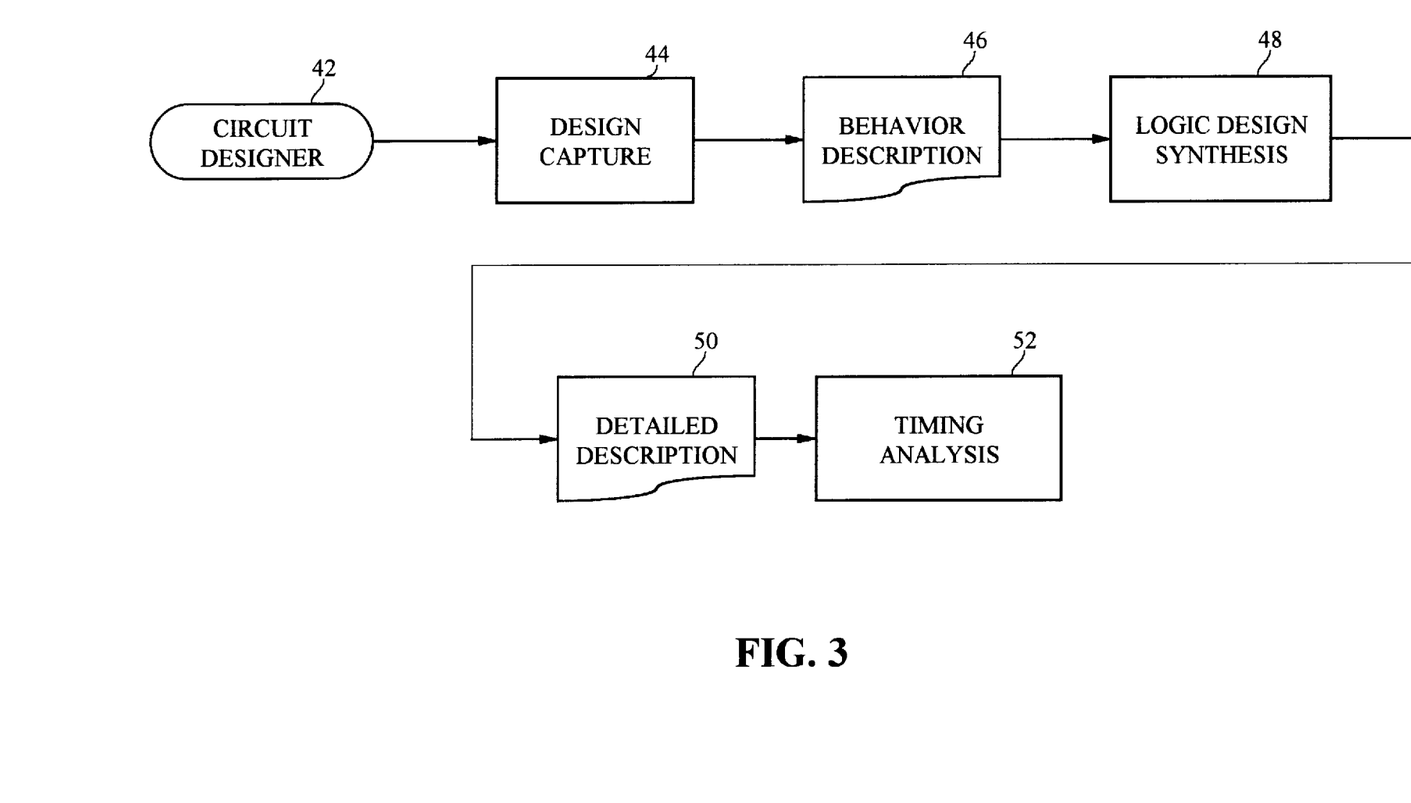
FIG. 3 is a block diagram of the process environment of the present invention.

FIG. 3 is a block diagram of the process environment of the present invention. The Circuit Designer 42 specifies the logic design of an integrated circuit by using Design Capture software 44. In the preferred embodiment, the Hardware Computer-Aided Design System (HCADS), available from Unisys Corporation, is used as Design Capture software 44, although other design capture programs from companies such as Cadence Design Systems, Inc., Synopsys, Inc., and Mentor Graphics, Inc., are also commercially available. The result of this activity is a Behavior Description file 46. The Behavior Description represents the logic design as specified at the register transfer level. Items in the Behavior Description file map to functional components of the design. Each component has a logical state name assigned to it by the Circuit Designer 42. The Behavior Description is input to Logic Design Synthesis software 48. Logic Design Synthesis software 48 creates the gates and other circuitry needed to implement the design specified by the Behavior Description. In the preferred embodiment, the Synthesis software comprises the Behavior to Structure Translator (BEST) synthesis tool developed by Unisys Corporation. However, alternate embodiments such as the VHDL or Verilog Design Compiler commercially available from Synopsys, Inc., the DesignBook synthesis tool from Escalade, and the Synergy synthesis tool available from Cadence Design Systems, Inc., may also be used. The Synthesis software 48 generates the Detailed Description file 50. This file contains the gate-level definition of the logic design.

The Detailed Description file 50 is input to a variety of other EDA software tools. The Detailed Description is sometimes referred to as the netlist for the design. Timing Analysis software 52 performs timing analysis on the logic design. Timing analysis must be performed on the gate-level implementation, not the logical design, because the drive and fanout of the integrated circuit design will affect the timing analysis, and, if incorrectly inserted, could affect functional results. Therefore, the Detailed Description must be provided to the Timing Analysis software.

Figure 4:
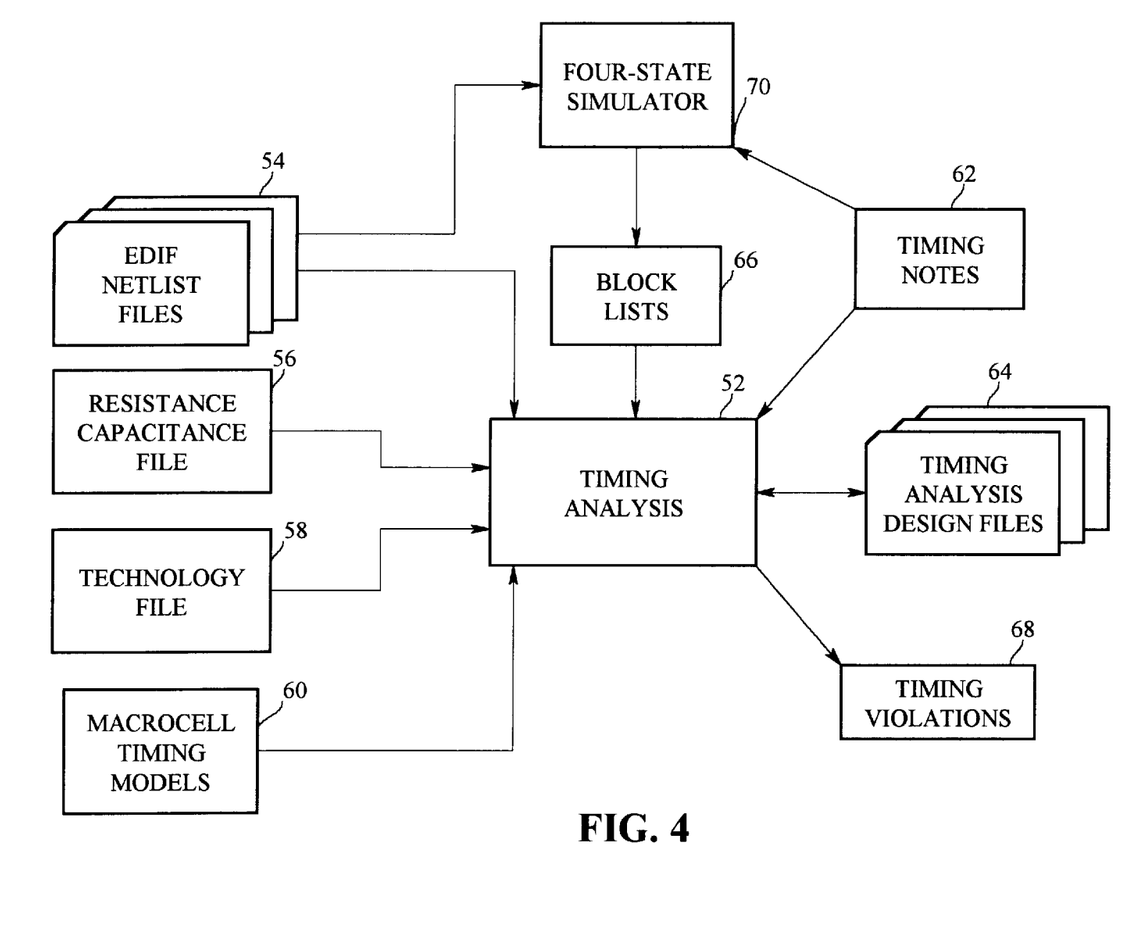
FIG. 4 is a block diagram of the data files used by the Timing Analysis software.

In the preferred embodiment, the present invention is implemented in the Timing Analysis 52 and associated software. Timing Analysis software operates on design netlists for integrated circuits, ASICs, ASIC subsections, multi-chip modules (MCMs), printed circuit boards (PCBs), backpanels, or other logic design entities. The Timing Analysis software converts these netlists into design files before performing the net tracing and delay calculations associated with conventional timing analysis. FIG. 4 is a block diagram of the data files used by the Timing Analysis software. Timing Analysis 52 reads six files for input data. The Electronic Data Interchange Format (EDIF) Netlist Files 54 contain the Detailed Description 50 of a level of the logic design in an EDIF format. EDIF is one of many standard formats for transferring logic design data between various electronic design automation tools. The Resistance Capacitance (RC) File 56 holds information on the resistance and capacitance factors for the logic cells and nets specified in The EDIF Netlist. The Technology File 58 contains data specific to the design technology of the logic components in the design (e.g., M5C, C5L). Macrocell Timing Models 60 contain cell specific data used to calculate the macro delays (setup, hold, propagation) through the cells. Timing Notes 62 are command directives to the Timing Analysis software that are written by the test engineer to control the processing of the Timing Analysis software. The Timing Analysis software 52 outputs Timing Analysis Design Files 64. These Design Files are internal representations of selected logic designs, including circuit delays. Also input are Block Lists 66, which are intermediate data representations of lists of points to be ignored during iterations of the Timing Analysis software. Timing violations that are detected by the Timing Analysis software 52 are stored in Timing Violations file 68. The Four-State Fault-Out Simulator 70 simulates selected portions of the integrated circuit design to identify points within the design where paths may be flagged for selected timing analysis. These points are stored in Block Lists 66.

Figure 5:
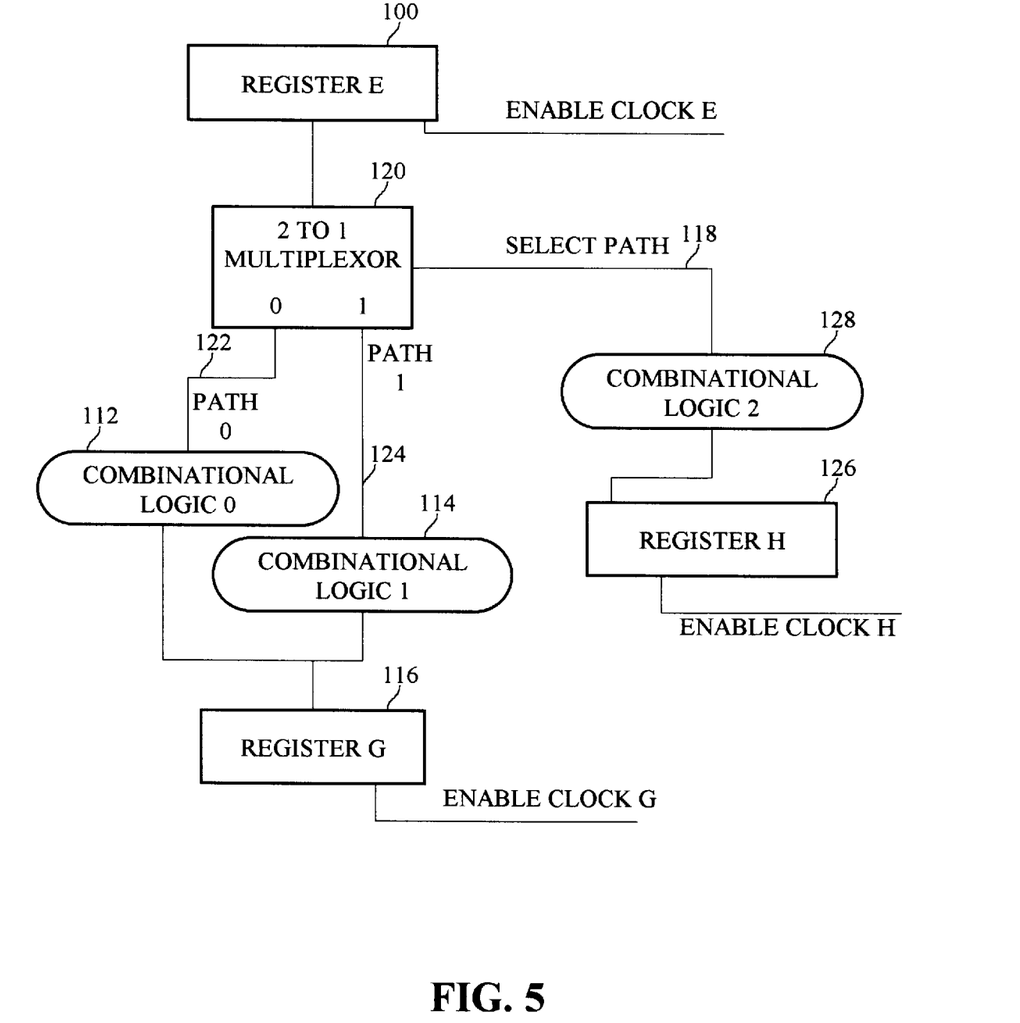
FIG. 5 is a diagram of an example of a circuit having parallel paths.
Figure 6:
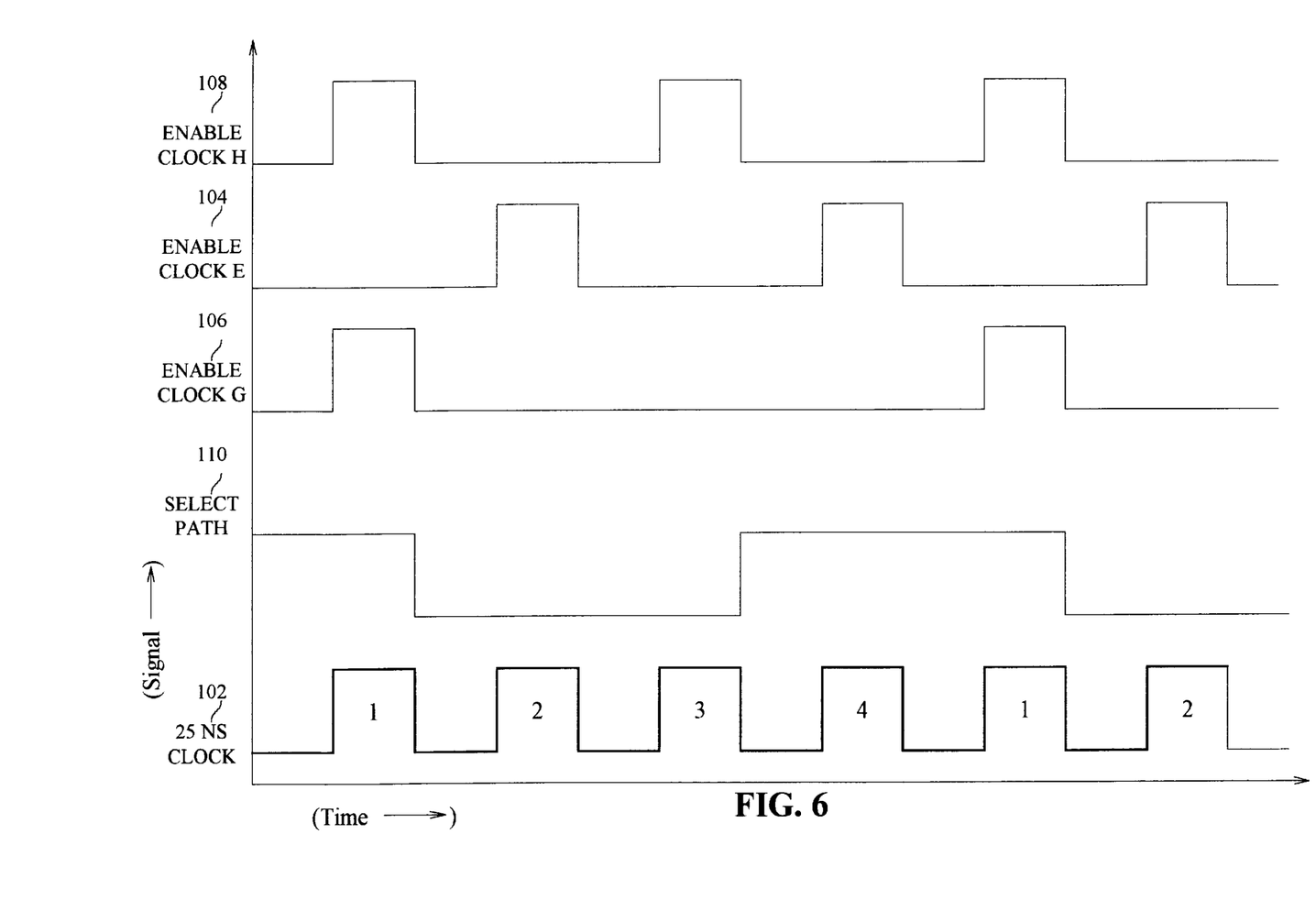
FIG. 6 is a timing diagram for the sample circuit of FIG. 5.

As mentioned above, the critical path timing algorithm is a faster method than the path enumeration method, but does not work well with designs having parallel paths with different timing limitations. This can be shown by reference to FIG. 5. FIG. 5 is a diagram of an example of a circuit having parallel paths. Register E 100 receives an Enable Clock E signal as shown in FIG. 6. FIG. 6 is a timing diagram for the sample circuit of FIG. 5. In this example, the clock is a 25 nanosecond clock 102. Three different enable clock pulses are denoted Enable Clock E 104, Enable Clock G 106, and Enable Clock H 108. Enable Clock E goes active on cycles two and four of the 25 nanosecond clock, thereby clocking data into Register E 100. Enable Clock G 106 goes active on cycle one of the 25 nanosecond clock. Enable Clock H goes active on cycles one and three of the 25 nanosecond clock. The Select Path signal 110 determines which data is passed through to Register E 100. Referring back to FIG. 5, assume for purposes of this example that the propagation time of Combinational Logic 0 112 is significantly shorter than the propagation time of Combinational Logic 1 114. Note that a parallel path exists from Register G 116 to Register E 100, because depending on the state of Select Path 118, the signal output from either Combinational Logic 0 112 or Combinational Logic 1 114 will propagate through the 2 To 1 Multiplexor 120 to Register E. The enable sequences, coupled with the multiplexor control logic of the 2 To 1 Multiplexor 120, results in Register E 100 being loaded from Path 0 122 on clock sequence 2, and from Path 1 124 on clock sequence 4. Register H 126, which feeds Combinational Logic 2 128 to set Select Path 118, is loaded during clock sequences one and three. Since the two paths (Path 0 122 and Path 1 124) have different timing requirements, the critical path algorithm cannot just ignore some paths (like Path 0), because another parallel path is associated with a longer delay. If this were done, a circuit designer or test engineer would never know if timing problems existed in some paths of the circuit (like Path 0).

Although the present example is quite simplistic for illustration purposes, in actual integrated circuit designs, parallel paths may arise under very complicated circumstances in the logic design. In fact, this example shows how parallel paths can be separated when a multiplexor is involved. However, many parallel paths can exist without a multiplexor such as this to separate them. Whatever the circumstances of causing a parallel path to exist, the theory underlying the present invention is the same: to find control points in the design which can be used to block certain paths, thereby ensuring complete timing analysis coverage.

The present invention is a process which uses a Four State Simulator 70 that allows a simulation algorithm to be used on integrated circuit designs employing parallel paths. Referring back to FIG. 4, the Four State Simulator 70 reads the EDIF Netlist Files 54 to obtain the structure of the integrated circuit design. The Simulator provides the capability to automatically flag circuit paths which are to be handled individually. Propagation delays are then calculated for the flagged paths despite the fact that some other paths actually have longer delays (i.e., the flagging mechanism forces the Timing Analysis software 52 not to ignore certain paths during a particular invocation). When the propagation delay is calculated for a flagged path, the Timing Analysis software 52 references the Timing Notes 62 and the Block Lists 66 produced by the Four-State Simulator 70 to determine the clock frequency for that path. Timing Analysis software can then determine if that path violated its particular timing constraints.

One prior art method for allowing circuit designers to flag a path for timing analysis purposes is by forcing them to list the logic levels associated with nets performing the multiplexor select function (see 2 To 1 Multiplexor 120 on FIG. 5). For example, in FIG. 5, the circuit designer could flag Path 0 122 by specifying "Select Path=0" in Register H 126. This method is very error prone, because many net and component names are not specified by the designers, but rather are given computer-generated names by logic synthesis software. Since computer-generated names may change with each pass through the logic synthesis program, new flags would have to be specified by the circuit designer or test engineer before each simulation and timing analysis run.

Another, even bigger, problem associated with forcing engineers to manually flag logic paths is the amount of logic tracing which may be required to accomplish this task. Circuit designers typically design logic by writing behavioral circuit equations. These equations are automatically converted to a circuit implementation by the synthesis program. Later, during the electronic design automation process, this circuit may be modified by an optimization program. The engineer is therefore not familiar with the actual implementation of the logic. For example, an engineer may incorporate a 6-to-1 multiplex function into the design. Logic synthesis software could implement this functionality using three 2-to-1 multiplexors and some additional control logic. Forcing the engineer to wade through this circuit implementation and determine how to flag a path would be very time-consuming and extremely error-prone, especially when one considers that current integrated circuit designs have tens, if not hundreds, of thousands of gates, and may contain register paths up to 72 bits wide.

The Four-State Simulator 70 provides a method for flagging points by specifying the contents of control registers.

The Simulator automatically traces through the logic implementation to determine what the specification means in terms of net names and logic levels. As one skilled in the art can see on FIG. 5, a circuit designer can flag Path 0 122 for individual attention during a particular execution of the Simulator by specifying that Bit 0 (for example) of Register H 126 equals 1. The Simulator then automatically traces through the Combination Logic 2 128 to determine that net Select Path 118 must be driven high to make the selection. As long as the definition of Register H 126 remains unchanged (as it likely will), no more human intervention is required, even if net names or other aspects of the implementation change. Identifying Select Path 118 and determining how to influence its state by setting certain register bits rather than by flagging nets are critical steps in solving the parallel path problem.

It may be advantageous to trace back through the logi design all the way back to a latch to be used as a control (or blocking) point, because latches tend to be stable. However, tracing all of the way back to a latch may result in having too many control points to block a path and it may be much easier, for instance, to use a decode signal coming from a register instead of multiple register bits. The logic designer could find a stable signal to use for this purpose and may even control logic synthesis tools to prevent changing certain signals, if necessary.

Figure 7:
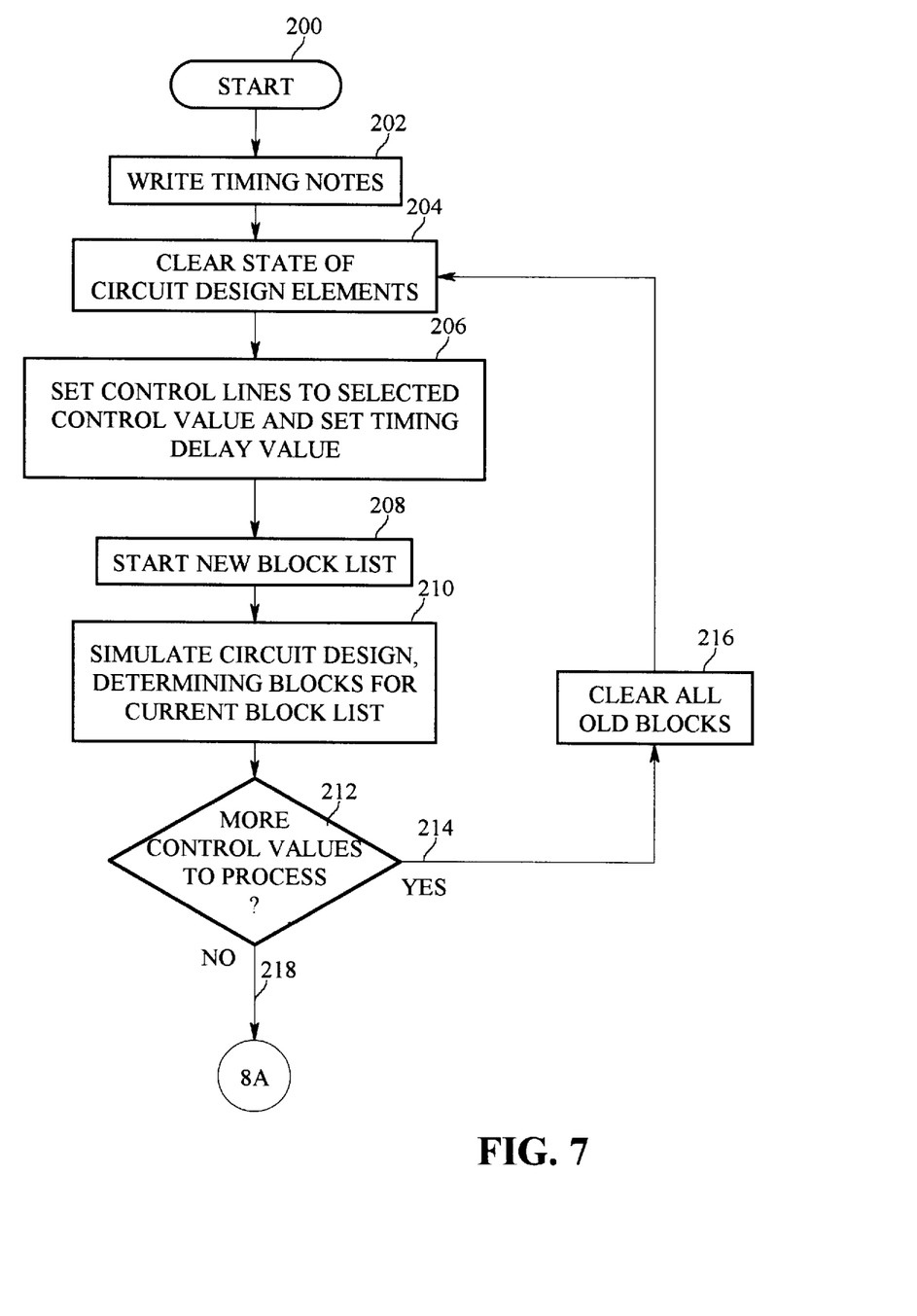
FIG. 7 and FIG. 8 are flow charts showing the steps for performing simulation and timing analysis according to the present invention.
Figure 8:
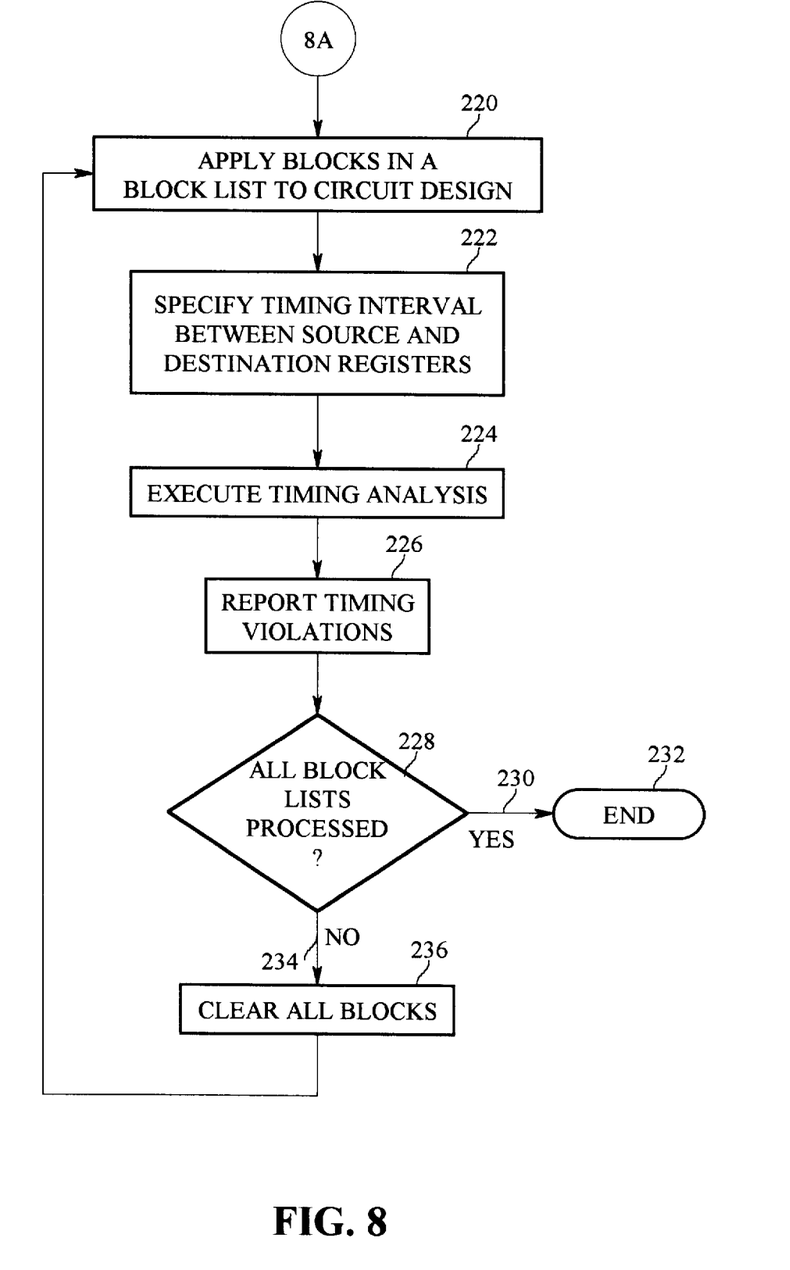

FIG. 7 and FIG. 8 are flow charts showing the steps for performing simulation and timing analysis according to the present invention. After Start Step 200, a test engineer writes a set of Timing Notes 62 (See also FIG. 4) at Step 202. The Timing Notes contain control information to direct the Four-State Simulator 70 and the Timing Analysis software 52 during processing of the integrated circuit design. The test engineer must write a sufficient number of discrete statements in the Timing Notes, one for each of the possible combination of values for control lines that affect a selected logic cone. That is, a statement is required for each of the possible values of control lines. For example, if only one control line is affecting a selected logic cone to be analyzed, one statement in the Timing Notes would describe conditions for when the control line has a value of 0, and another statement would describe conditions for when the control line has a value of 1. If there were two bits (lines) used to control a cone, then four statements would be required, and so on. Since the control logic of many integrated circuit designs is very complex (often including up to 72 control lines at any given point in the logic), one skilled in the art can see that generation of a complete set of Timing Notes is a non-trivial task. Each statement will list a net in the subject logic cone, a timing delay value for propagation of a signal across that net, and a control value for the control line to cause a signal to be propagated. When the logic cone is subjected to multiple timing constraints (i.e., it has parallel paths), a plurality of timing delay values will be listed in the set of statements for a given logic cone.

Next, at Step 204, the current state of all elements in the circuit design are cleared (set to an unknown state). When using a Four-State Simulator, the possible values for nets include 0, 1, X (don't care), and U (unknown). At Step 206, the Four-State Simulator 70 sets the control lines to the first set of selected control values from the Timing Notes. Also set is the timing delay value for this set of control values. A new Block List 66 is created for this set of control values at Step 208. A Block List holds a set blocking points where paths through the selected logic cone are to be traced on the pass executed by the Timing Analysis software which takes the Block List as input. At Step 210, a boolean simulation is performed on the circuit design by the Four-State Simulator 70. No clocking specifications for the circuit are used during this step. A set of blocks are identified by the Simulator and stored in the current Block List data structure. When identifying block points in the circuit design, the Simulator looks at the state of all gates to flag paths that will be forced to be traced according to the following rule. For any gate in the circuit design which has a known value on its output (either 0 or 1), if any input to that gate has an unknown value, then block that input to the gate (which blocks tracing of the path) for this particular set of values for the control lines. These block points are then stored in the current Block List. After analyzing the entire circuit design in this fashion, the Simulator has created a set of block points (that is, a Block List) for the current set of control values. The nets at the block points will be traced by the Timing Analysis software 52.

At Test Step 212, if there are more control values to process, then Yes path 214 is taken to Step 216, where all existing block points are cleared. Processing continues with the next set of control values and timing delays after clearing the state of the circuit design elements at Step 204. If all control value combinations have been processed, then No path 218 is taken to Step 220 on FIG. 8 via connector 8A. At Step 220, blocks from the current block list are applied to the circuit design at the listed block points. At Step 222, the timing interval between the source and destination registers in the logic cone are specified. Next, at Step 224, the Timing Analysis software 52 reads the current Block List, and executes a timing analysis to detect timing violations on the paths in the circuit design that are flagged by items on the current Block List. In the preferred embodiment, Timing Analysis software 52 is executing a critical path analysis algorithm. Any tiling violations found are reported at Step 226. If all block lists have been processed at Step 228, then Yes path 230 is taken to End Step 232 where processing terminates. If there are more Block Lists to process, then No path 234 is taken to Step 236. At this step, all existing block points are cleared in the circuit design and processing of the next Block List commences at Step 220. Those skilled in the art will readily see that Timing Analysis 52 makes multiple passes through the circuit design, processing a different set of paths in the circuit according to the Block List items during each iteration. However, these multiple passes may be processed in parallel by multiple copies of Timing Analysis software 52 executing on a plurality of processors.

A process for improving timing violation detection processing for checking the design of integrated circuits having parallel paths with different timing requirements has been described. The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended claims.

We claim:

1. In a system for performing timing analysis on circuit designs having different timing constraints for multiple parallel paths, a computer-implemented method comprising the steps of:

(a) clearing the state of the circuit design;

(b) setting control lines in the circuit design to a selected set of control signals;

(c) identifying blocking points of the circuit design to be flagged for timing analysis by simulating the circuit design with said selected set of control signals as input signals;

(d) adding said blocking points to a list, said list identifying paths in the circuit design to be analyzed and further indicating portions of the circuit design to be disregarded during timing analysis;

(e) repeating steps (a)–(d) for all possible sets of control signals; and (f) performing timing analysis on the circuit design using said lists.

2. The computer-implemented method of claim 1, wherein the circuit designs each include nets and gates, each of said gates having input and output terminals, and wherein step (c) identifies each of said blocking points as being an input terminal of an associated gate, said input terminal receiving a net having an unknown logic level when said associated gate drives a net having a known logic level and when said selected set of control signals are selected for said control lines.

3. The computer-implemented method of claim 1, wherein step (f) performs timing analysis by executing a critical path algorithm.

4. A system for performing timing analysis on a circuit design of a circuit including nets and components, wherein predetermined ones of the components are state devices, the circuit further having control lines to control the transfer of data signals from ones of the state devices to others of the state devices, the circuit including paths, each path comprising nets and components that interconnect a driving one of the state devices and a receiving one of the state devices and whereby the driving one of the state devices can propagate a signal to the receiving one of the state devices, ones of the paths being parallel paths, wherein each of the parallel paths is associated with at least one other parallel path, the parallel paths which are associated each drive the same state device and have a different maximum allowable propagation delay from one another such that the paths which are associated have different timing constraints, the system for performing timing analysis on the circuit design, comprising:

storage means for storing identifiers of paths in a circuit design to be analyzed;

simulation means coupled to said storage means, said simulation means for associating a predetermined initial logical state with each net and each state device in said circuit design, for setting control lines in said circuit design to a selected logical state, for identifying blocking points of the circuit design to be flagged for timing analysis by simulating said circuit design with said selected set of control lines set to said selected logical state and utilized as input signals, and for storing said blocking points in said storage means; and timing analysis means coupled to said storage means for performing timing analysis on the circuit design using said blocking points, whereby each of said blocking points indicates paths of the circuit to be temporarily disregarded during timing analysis.

5. The system of claim 4, wherein each of the components have an input terminal and an output terminal, wherein said simulation means further includes means for identifying each of said blocking points as an input terminal of a component that receives, during simulation, a signal having an unknown logical state, and wherein said component drives an output net having a known logical state.

6. The system of claim 4, wherein each of the nets and each of the state devices in the circuit design may at a given point in time be associated with any one of four predetermined logical states, and wherein said simulation means is capable of performing boolean simulation on the circuit design using the associated ones of said four predetermined logical states.

7. The system of claim 4, wherein said timing analysis means includes means for executing a critical path algorithm.

8. The system of claim 4, further including means for storing timing notes written by a test engineer, said timing notes being input to said simulation means and said timing analysis means to direct simulation and timing analysis processing.

9. The system of claim 4, further including means for reporting timing violations found in said circuit design by said timing analysis means.

10. In an electronic design automation system for performing timing analysis on integrated circuit designs having gates and nets, ones of the gates being state devices receiving a clock signal, ones of the nets being control lines for controlling the transfer of data signals from ones of the state devices to other ones of the state devices, the integrated circuit design further including paths including gates and nets, ones of the paths being parallel paths such that each of the parallel paths is associated with at least one other parallel path and the associated parallel paths each drives the same one of the state devices, and wherein ones of the associated parallel paths have different timing constraints, a computer-implemented method, comprising the steps of:

(a) writing timing notes to direct boolean simulation and timing analysis processing on an integrated circuit design;

(b) clearing the state of nets in said integrated circuit design;

(c) setting control lines in said integrated circuit design to a selected set of control signals;

(d) setting a timing delay constraint for paths selected by said selected set of control signals;

(e) creating a block list for storing identifiers of nets of said integrated circuit design to be flagged for timing analysis;

(f) identifying blocking points by simulating said integrated circuit design with said selected set of control signals as input signals, said blocking points identifying which paths of the integrated circuit design are not to be processed during timing analysis;

(g) recording the identification of said blocking points within said block list;

(h) repeating steps (b)–(g) for all possible sets of control signals;

(i) performing critical path timing analysis on said integrated circuit design, said block lists identifying which paths in the integrated circuit design are to be analyzed and which paths are to be temporarily ignored; and (j) reporting any timing violations detected by step (i).

11. The computer-implemented method of claim 10, wherein said blocking points are identified for each net input to a gate in said integrated circuit design having an unknown value on an input net and a known value on an output net from said gate for said selected set of control signals.

12. A system for performing timing analysis on a representation of a circuit design including nets and further including parallel paths having different timing constraints, comprising:

identification means for identifying ones of the nets as control lines which control the transfer of data signals within the circuit design;

simulation means coupled to said identification means for receiving the identification of said control lines, said simulation means for initializing the representation of the circuit design to a predetermined initial state, for setting ones of said control lines to a predetermined logical state, and for performing boolean simulation to identify ones of the paths in the circuit design which do not affect the operation of the circuit design when said control lines are set to said predetermined logical state, said identified ones of the paths being designated as unselected paths; and timing analysis means coupled to said storage means for receiving identities of said unselected paths, and for performing timing analysis on the representation of the circuit design without analyzing said unselected paths.

13. The system of claim 12 wherein said timing analysis means further includes means for performing critical path timing analysis.

14. The system of claim 12 wherein said simulation means further includes means to cause said boolean simulation to be automatically performed for all allowable logical states of said control lines.

15. In an electronic design automation system for performing timing analysis on a circuit design having combinational logic components, state devices, and nets, the circuit design further including paths which include those combinational logic components and nets which may provide a signal from an associated driving one of the state devices to an associated receiving one of the state devices, ones of the paths being parallel paths such that each of the parallel paths is associated with at least one other parallel path and the associated ones of the parallel paths each drive the same one of the state devices and have timing delay constraints which are different from each other, a computer-implemented method comprising the steps of:

(a) writing timing notes to indicate ones of the nets which are control signals;

(b) setting the state of nets and state devices in said circuit design to a predetermined initial state;

(c) setting selected ones of said control signals to a predetermined logical state;

(d) setting a timing delay constraint for paths selected by said selected ones of said control signals when said ones of said control signals are set to said predetermined logical state;

(e) performing boolean simulation to identify those paths of said circuit design which are not selected by said ones of said selected control signals when said selected ones of said control signals are set to said predetermined logical state;

(f) recording the identities of the paths identified in step (e) in a block list which is associated with said predetermined logical state of said selected ones of said control signals;

(g) repeating steps (b)–(f) for all possible logical states of said control signals;

(h) designating all paths in the circuit design as not being blocked paths;

(i) designating all paths recorded in a selected one of said block lists as blocked paths within the circuit design;

(j) performing timing analysis to locate timing violations existing in the circuit design, said critical path timing analysis temporarily disregarding said blocked paths; and (k) repeating steps (h)–(j) for each of said block lists created in said steps (b)–(f).

16. The computer-implemented method of claim 15, wherein said step of performing timing analysis includes performing critical path timing analysis.

17. The computer-implemented method of claim 15, wherein said step (e) includes the steps of:

(e1) identifying combinational logic components driving nets with a known logical state;

(e2) determining if any of said identified combinational logic components identified in step (e1) have an input terminal having an unknown logical state and which is associated with a driven net with a known logical state; and (e3) identifying paths driving said inputs terminals identified is said step (e2) as being paths which are not selected.

* * * * *